United States Patent
Yumoto (10) Patent No.: US 9,224,819 B2
(45) Date of Patent: Dec. 29, 2015

(54) SEMICONDUCTOR DEVICE AND METHOD FOR MANUFACTURING THE SAME

(71) Applicant: Kabushiki Kaisha Toshiba, Minato-ku (JP)

(72) Inventor: Miki Yumoto, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/597,834

(22) Filed: Jan. 15, 2015

(65) Prior Publication Data

US 2015/0126024 A1   May 7, 2015

Related U.S. Application Data

(62) Division of application No. 13/655,901, filed on Oct. 19, 2012, now Pat. No. 8,987,747.

(30) Foreign Application Priority Data

Mar. 6, 2012   (JP) ................. 2012-048899

(51) Int. Cl.
    *H01L 21/3205*   (2006.01)
    *H01L 21/4763*   (2006.01)
    *H01L 29/20*     (2006.01)
    (Continued)

(52) U.S. Cl.
    CPC ........ *H01L 29/2003* (2013.01); *H01L 21/0217* (2013.01); *H01L 29/0603* (2013.01); *H01L 29/42364* (2013.01); *H01L 29/66462* (2013.01); *H01L 29/7787* (2013.01); *H01L 29/78* (2013.01)

(58) Field of Classification Search
    CPC ............. H01L 29/2003; H01L 29/66462; H01L 29/7787
    USPC ............. 438/48, 60, 172, 285, 590, 591
    See application file for complete search history.

(56) References Cited

U.S. PATENT DOCUMENTS

7,985,986 B2 * 7/2011 Heikman et al. .............. 257/194
2005/0263775 A1 * 12/2005 Ikeda et al. .................... 257/79
2010/0244044 A1   9/2010 Li et al.

FOREIGN PATENT DOCUMENTS

JP   2005-260172   9/2005
JP   2009-054807   3/2009
(Continued)

OTHER PUBLICATIONS

Office Action mailed Jun. 24, 2014 in Japanese Application No. 2012-048899 filed Mar. 6, 2012 (w/English translation).
Office Action mailed Jan. 6, 2015 in Japanese Application No. 2012-048899 filed Mar. 6, 2012 (w/English translation).

*Primary Examiner* — Hung Vu
(74) *Attorney, Agent, or Firm* — Oblon, McClelland, Maier & Neustadt, L.L.P.

(57) ABSTRACT

A semiconductor device of an embodiment includes a semiconductor layer formed of a III-V group nitride semiconductor, a first silicon nitride film formed on the semiconductor layer, a gate electrode formed on the first silicon nitride film, a source electrode and a drain electrode formed on the semiconductor layer such that the gate electrode is interposed between the source electrode and the drain electrode, and a second silicon nitride film formed between the source electrode and the gate electrode and between the drain electrode and the gate electrode and having an oxygen atom density lower than that of the first silicon nitride film.

2 Claims, 6 Drawing Sheets (51) Int. Cl.
*H01L 29/66* (2006.01)
*H01L 29/778* (2006.01)
*H01L 29/78* (2006.01)
*H01L 21/02* (2006.01)
*H01L 29/06* (2006.01)
*H01L 29/423* (2006.01)

(56) References Cited

FOREIGN PATENT DOCUMENTS

| | | |
|---|---|---|
| JP | 2010-225979 | 10/2010 |
| JP | 2011-198974 | 10/2011 |

* cited by examiner

FIG.11

SEMICONDUCTOR DEVICE AND METHOD FOR MANUFACTURING THE SAME

CROSS-REFERENCE TO RELATED APPLICATION

This application is a division of and claims the benefit of priority under 35 U.S.C. §120 from U.S. Ser. No. 13/655,901 filed Oct. 19, 2012, and claims the benefit of priority under 35 U.S.C. §119 from Japanese Patent Application No. 2012-048899 filed Mar. 6, 2012, the entire contents of each of which are incorporated herein by reference.

FIELD

Embodiments described herein relate generally to a semiconductor device and a method for manufacturing the same.

BACKGROUND

Nitride-based semiconductor materials having high electric field strength are highly expected to be applied to semiconductor devices for power electronics, high frequency power semiconductors, or the like. However, it is also known that they suffer from a phenomenon called current collapse in which a drain current decreases significantly during application of a stress such as a high voltage, which influences the characteristics of semiconductor devices. Moreover, reduction in a gate leakage current indeed needs to be achieved to increase a breakdown voltage of a semiconductor device, and use of a gate insulation film is known to be useful in achieving the purpose.

In order to realize a high performance nitride-based semiconductor device, it is demanded to achieve a configuration which can take balance between suppression of the current collapse and reduction in the gate leakage current.

DETAILED DESCRIPTION

A semiconductor device of an embodiment includes a semiconductor layer formed of a III-V group nitride semiconductor, a first silicon nitride film formed on the semiconductor layer, a gate electrode formed on the first silicon nitride film, a source electrode and a drain electrode formed on the semiconductor layer such that the gate electrode is interposed between the source electrode and the drain electrode, and a second silicon nitride film which is formed between the source electrode and the gate electrode and between the drain electrode and the gate electrode, and which has an oxygen atom density lower than that of the first silicon nitride film.

First Embodiment

A semiconductor device of the present embodiment includes a semiconductor layer formed of a III-V group nitride semiconductor, a first silicon nitride film formed on the semiconductor layer, a gate electrode formed on the first silicon nitride film, a source electrode and a drain electrode formed on the semiconductor layer such that the gate electrode is interposed between the source electrode and the drain electrode, and a second silicon nitride film which is formed between the source electrode and the gate electrode and between the drain electrode and the gate electrode and which has an oxygen atom density lower than that of the first silicon nitride film.

Figure 1:
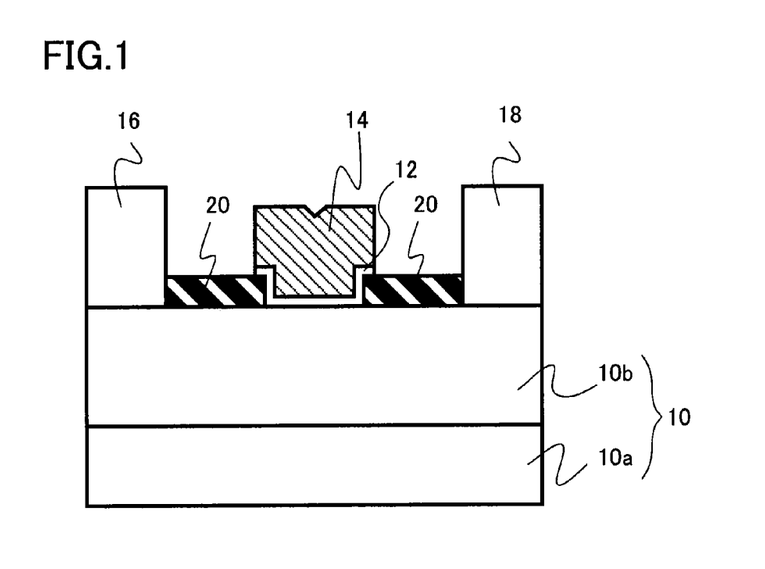
FIG. 1 is a cross-sectional view that illustrates a configuration of a semiconductor device of a first embodiment.

FIG. 1 is a cross-sectional view showing a configuration of a semiconductor device of the present embodiment. The semiconductor device is formed on a semiconductor layer 10 formed of an III-V group nitride semiconductor. The semiconductor layer 10 has a structure in which a barrier layer 10b formed of, for example, any of gallium nitride (GaN), aluminum nitride gallium (AlGaN), or indium nitride aluminum (InAlN), or a combination thereof is stacked on an operation layer 10a formed of GaN. A hetero junction interface is formed between the operation layer 10a and the barrier layer 10b. For example, the operation layer 10a is 1 μm in film thickness, and the barrier layer 10b is 30 nm in film thickness.

The present embodiment shows an example of a high-electron-mobility-transistor (HEMT) which is a field effect transistor using a hetero junction between two semiconductor layers. However, the number of semiconductor layers is not limited to two, and the configuration of the present embodiment may be applied to semiconductor layers having various layered-structures. The HEMT that uses a hetero junction like the present embodiment can reduce on-resistance because the channel mobility is high, and thus is suitably used for semiconductor devices for power electronics. Moreover, the high channel mobility is also suitable for high frequency operation.

A first silicon nitride film 12 is formed on the semiconductor layer 10. The first silicon nitride film 12 functions as a gate insulation film. A gate electrode 14 is formed on the first silicon nitride film 12. The gate electrode 14 is, for example, a metal electrode. The metal electrode is, for example, a nickel (Ni) electrode or a titanium (Ti) electrode.

Moreover, a source electrode 16 and a drain electrode 18 are provided on the semiconductor layer 10, with the gate electrode 14 interposed between them. Each of the source electrode 16 and the drain electrode 18 is separated from the gate electrode 14. The source electrode 16 and the drain electrode 18 are, for example, metal electrodes. The metal electrode is an electrode containing, for example, aluminum (Al) as a main component.

A second silicon nitride film 20 which has an oxygen atom density lower than that of the first silicon nitride film 12 is formed on the semiconductor layer 10 between the source electrode 16 and the drain electrode 18. The second silicon nitride film 20 is formed in contact with the semiconductor layer 10. The second silicon nitride film 20 functions as a surface passivation film (or a passivation film) which protects the surface of the semiconductor layer 10 between the gate electrode 14 and the source electrode 16 and between the gate electrode 14 and the drain electrode 18.

As described above, a problem with such a semiconductor device which uses a nitride-based semiconductor is the current collapse phenomenon in which the drain current decreases significantly when a stress such as a high voltage is applied. In suppressing the current collapse phenomenon, it is an effective way to form a silicon nitride film on the surface of the nitride-based semiconductor. It is because such a configuration can reduce the interface state density in the interface between the semiconductor and the insulation film. Such a configuration is advantageous not only for reduction in the current collapse which can be achieved due to the reduction in the interface state density but also for high frequency operation.

Moreover, it is necessary to suppress the gate leakage current to achieve the high breakdown voltage. Suppression of leakage current can be achieved by using an insulation film with a high dielectric breakdown electric field. However, when the interface state density in the interface between the gate insulation film and the nitride-based semiconductor is high, hysteresis in device characteristic occurs, which causes a threshold voltage to fluctuate and which leads to an unstable semiconductor device operation.

Moreover, although increasing the film thickness of a gate insulation film is an effectively way to reduce the gate leakage current, such a technique brings about a problem that, as the thickness of the gate insulation film is increased, the distance between a channel layer and a gate electrode is increased. As a result, the threshold voltage of the transistor greatly shifts to the negative side, which is disadvantageous for a switching element.

In the present embodiment, the silicon nitride film is used for both the gate insulation film and the surface passivation film. The first silicon nitride film 12 with a high oxygen atom density is used for the gate insulation film. As a result, it is possible to suppress the gate leakage current without increasing the interface state density.

The second silicon nitride film 20 having an oxygen atom density lower than that of the first silicon nitride film 12 is used as the surface passivation film. As a result, it becomes possible to reduce the number of electrons trapped in the surface passivation film or between the surface passivation film and semiconductor layer 10.

Therefore, according to the semiconductor device of the present embodiment, the configuration which can take balance between suppression of the current collapse and reduction in the gate leakage current to can be achieved.

Here, the oxygen atom density of the first silicon nitride film is desirably $1\times10^{21}$ atoms/cm$^3$ or less. It is because the characteristic fluctuation is likely to occur, when the oxygen atom density is higher than $1\times10^{21}$ atoms/cm$^3$ and the interface state density is increased, due to an increased interface state density and an increase in the number of electrons trapped in the gate insulation film and between the gate insulation film and the semiconductor 10.

Moreover, it is desirable that the oxygen atom density of the second silicon nitride film 20 is one digit or more lower than the oxygen atom density of the first silicon nitride film 12. It is because, under such a condition, the current collapse can be sufficiently suppressed.

In addition, a hydrogen atom density of the first silicon nitride film 12 is desirably one digit or more lower than a hydrogen atom density of the second silicon nitride film 20, and more desirably lower by two digits or more. It is because, as the hydrogen atom density of the first silicon nitride film 12 is decreased, the gate leakage current can be reduced. It is desirable that the absolute value of the hydrogen atom density is $1\times10^{21}$ atoms/cm$^3$ or below.

As for the first silicon nitride film 12 functioning as the gate insulation film, it is desirable to have a thick film thickness in terms of reduction in leakage current. However, as described above, as the thickness is increased, the threshold voltage becomes larger. Therefore, it is desirable that the film thickness is 50 nm or less when it is considered that the silicon nitride film is used for a switching element for the power electronics.

Moreover, when a high electrical field is applied to an element serving as a semiconductor for power electronics, the high electrical field is also applied to a surface passivation film of the element when the element is a horizontal element. For this reason, the second silicon nitride film 20 serving as the surface passivation film needs to have a predetermined thickness, and the thickness is desirably 100 nm or more.

FIGS. 2 to 6 are cross-sectional views of steps of a method for manufacturing the semiconductor device of the present embodiment.

Figure 2:
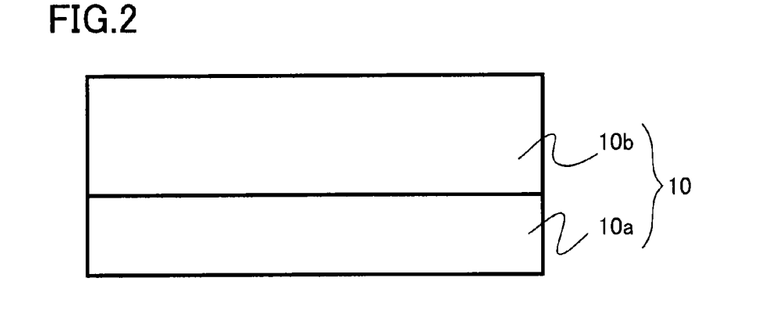
FIG. 2 is a cross-sectional view showing a step of a method for manufacturing the semiconductor device of the first embodiment.

First, as shown in FIG. 2, a semiconductor layer 10 as a nitride semiconductor is prepared in which a barrier layer 10b is stacked on an operation layer 10a.

Figure 3:
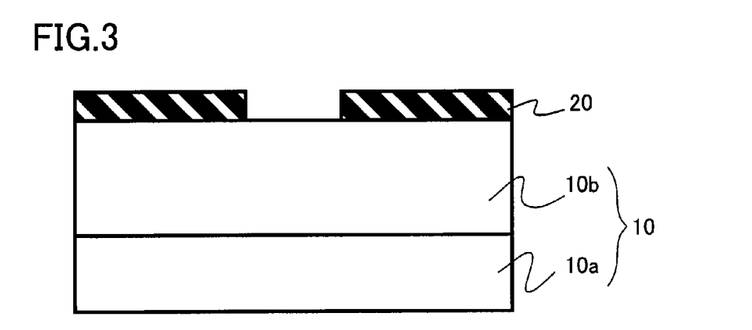
FIG. 3 is a cross-sectional view showing another step of the method for manufacturing the semiconductor device of the first embodiment.

Next, a second silicon nitride film 20 is formed on the semiconductor layer 10 as shown in FIG. 3. It is desirable that the second silicon nitride film 20 is formed by using a PE-CVD method from a view point that a silicon nitride film with a relatively low oxygen atom density can be formed with such a method.

After that, a mask is formed by using a lithography technology, and then a portion of the second silicon nitride film 20 in which a gate insulation film and a gate electrode are to be formed is removed by using an RIE (Reactive Ion Etching) technology, etc.

Figure 4:
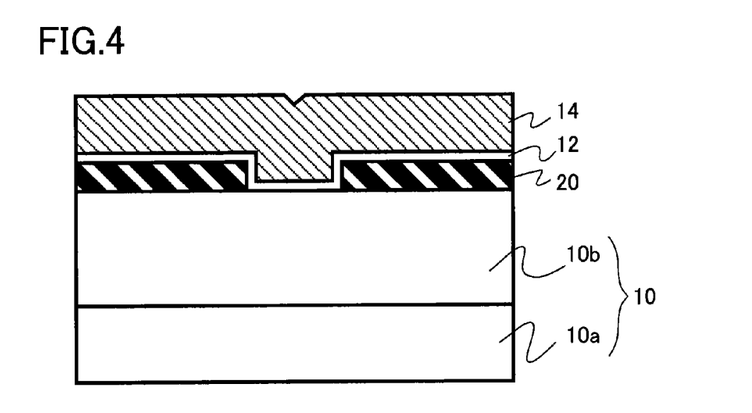
FIG. 4 is a cross-sectional view showing a further step of the method for manufacturing the semiconductor device of the first embodiment.

Next, a first silicon nitride film 12 to be a gate insulation film is formed on the semiconductor layer 10 from which the second silicon nitride film 20 is removed and on the second silicon nitride film 20 as shown in FIG. 4.

One of various methods such as a PE-CVD method, a catalytic-CVD (Cat-CVD) method, and an ECR sputtering method may be used as a method for depositing the first silicon nitride film 12. Among these methods, it is desirable to use the ECR plasma deposition method, which is a kind of the ECR sputtering method from a view point that a silicon nitride film with a relatively high oxygen atom density and a relatively low hydrogen atom density can be formed with the method. One of various methods such as a PE-CVD method, a Cat-CVD method, and an ECR sputtering method may be used as a method for depositing the first silicon nitride film 12.

In the ECR plasma deposition method, since a solid source such as silicon and an ECR plasma stream of oxygen or nitrogen are brought into direct contact with each other, a silicon nitride film can be deposited without producing an intermediate product unlike the CVD. Moreover, a silicon nitride film containing a small content of hydrogen can be formed by using the ECR plasma deposition method. In addition, a silicon nitride film with good step coverage can be deposited.

As a method for adding oxygen in the ECR plasma deposition method, a gas prepared by adding a trace amount of gaseous oxygen to a nitrogen gas may be used, and oxygen coming out of quartz parts used in manufacturing equipment may be used.

After that, a metal film to be a gate electrode 14 is formed on the first silicon nitride film 12, for example, by using a sputtering method.

Figure 5:
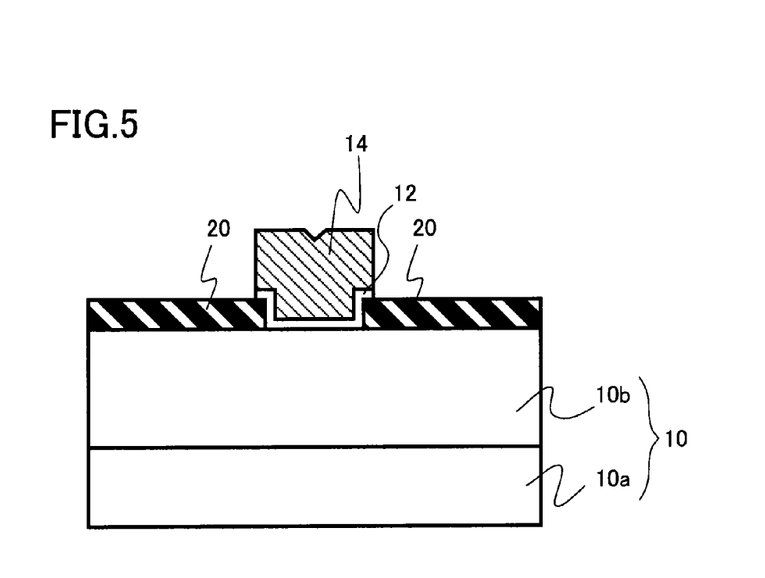
FIG. 5 is a cross-sectional view showing a yet further step of the method for manufacturing the semiconductor device of the first embodiment.

Next, a mask is formed by using a lithography technique, and then the metal film and the first silicon nitride film 12 are patterned by using an RIE technology or the like, so that the gate insulation film and the gate electrode 14 are formed as shown in FIG. 5.

Figure 6:
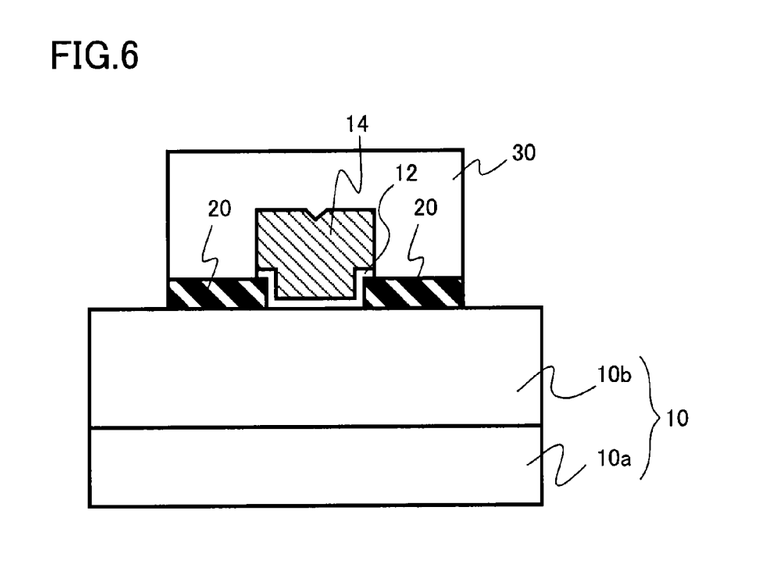
FIG. 6 is a cross-sectional view showing a yet further step of the method for manufacturing the semiconductor device of the first embodiment.

Next, a mask based on a resist 30 is formed by using a lithography technology as shown in FIG. 6, and then a portion of the second silicon nitride film 20 in which a source electrode and a drain electrode are to be formed is removed by using an RIE technology or the like. After that, a metal film, for example, an aluminum film is formed on the resist 30, and then the metal film is partially removed by a lift-off method. As a result, the aluminum film remains only at portions in which the source and drain electrodes are to be formed.

The semiconductor device shown in FIG. 1 is manufactured through the above-described manufacturing method. Consequently, the second silicon nitride film 20 having an oxygen atom density lower than that of the first silicon nitride film 12 is formed on the semiconductor layer 10, on both sides of the gate electrode 14.

Figure 7:
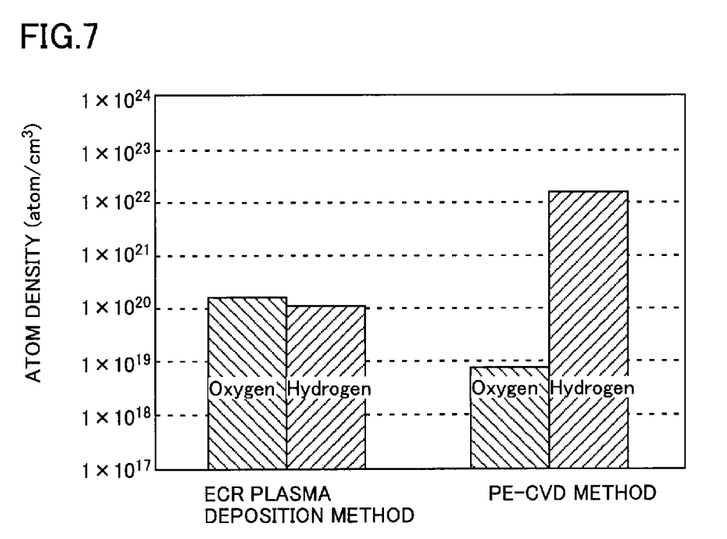
FIG. 7 is a diagram showing densities of oxygen and hydrogen atoms in silicon nitride films deposited with an electron cyclotron-resonance (ECR) plasma film deposition method and a plasma-enhanced chemical-vapor-deposition (PE-CVD) method, respectively.

FIG. 7 is a diagram showing an example of oxygen and hydrogen atom densities in silicon nitride films deposited by using an ECR plasma deposition method and a PE-CVD method. The vertical axis indicates atom densities in the films evaluated with SIMS (Scanning Ion Mass Spectrometry).

As shown in FIG. 7, a silicon nitride film having a relatively high oxygen atom density and a relatively low hydrogen atom density can be deposited by using an ECR plasma deposition method. Moreover, the silicon nitride film with a relatively low oxygen atom density can be deposited by using a PE-CVD method.

Figure 8:
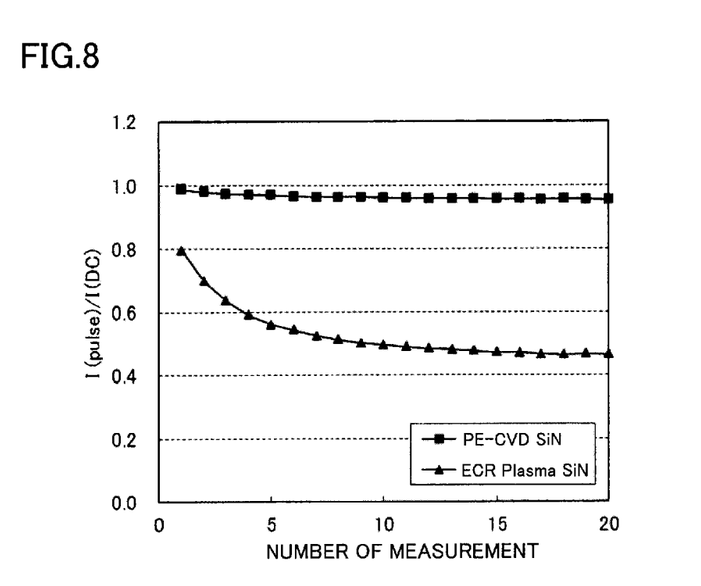
FIG. 8 is a diagram showing a current collapse suppressing effect.

FIG. 8 is a diagram showing a current collapse suppressing effect. The current collapse was evaluated using evaluation transistors in which a Schottky junction was formed between a gate electrode and a semiconductor layer. A silicon nitride film deposited by using an ECR plasma deposition method and a silicon nitride film deposited by using a PE-CVD method were used as a surface passivation film formed between a source electrode and a gate electrode and between a drain electrode and a gate electrode.

A gate voltage was changed in a state in which a constant voltage of 10 V was applied between the source electrode and the drain electrode. The current collapse was evaluated by calculating a ratio between a current value (I (DC)) measured by DC measurement and a current value (I (pulse)) measured by pulse measurement. The measurements were performed a plurality of times for a predetermined time, and consequently a change with time was evaluated. In the drawing, when the value on the vertical axis was 1.0, the current collapse will not be generated.

As clearly understood from FIG. 8, the current collapse phenomenon is suppressed when a silicon nitride film deposited by using a PE-CVD method is used as a surface passivation film.

According to the semiconductor device of the present embodiment and the method for manufacturing the same, a configuration which can take balance between suppression of the current collapse and reduction in the gate leakage current is achieved.

Second Embodiment

Figure 9:
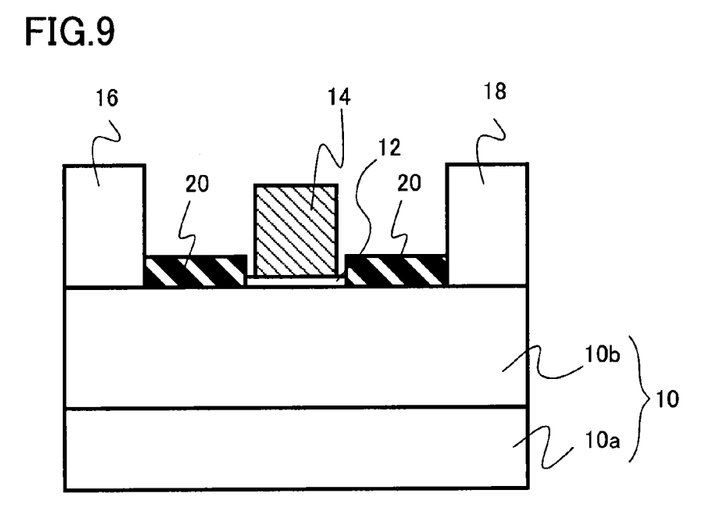
FIG. 9 is a cross-sectional view showing a configuration of a semiconductor device of a second embodiment.

FIG. 9 is a cross-sectional view showing a configuration of a semiconductor device of the present embodiment. The present embodiment is the same as the first embodiment except that a first silicon nitride film 12 is not provided between a gate electrode 14 and a second silicon nitride film 20 serving as a surface passivation film. Therefore, the contents which are a duplicate of the first embodiment will not be described.

The same effect as the first embodiment can be achieved also by the present embodiment.

Third Embodiment

Figure 10:
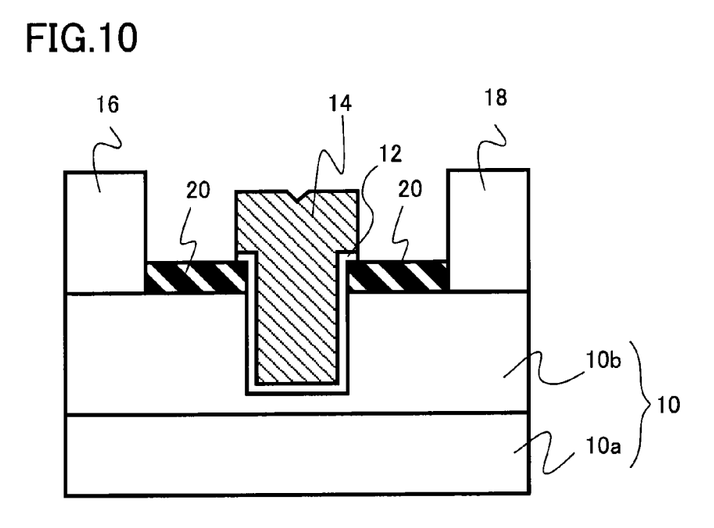
FIG. 10 is a cross-sectional view showing a configuration of a semiconductor device of a third embodiment.

FIG. 10 is a cross-sectional view showing a configuration of a semiconductor device of the present embodiment. The present embodiment is the same as the first embodiment except that a first silicon nitride film 12 serving as a gate insulation film and a gate electrode 14 are formed in a trench provided in a barrier layer 10b of a semiconductor layer 10. Therefore, the contents which are a duplicate of the first embodiment will not be described.

The same effect as the first embodiment can be achieved also by the present embodiment. In addition, by shortening the distance between the gate electrode 14 and the operation layer 10a, it becomes easy to form a field effect transistor of a normally-off type.

Fourth Embodiment

Figure 11:
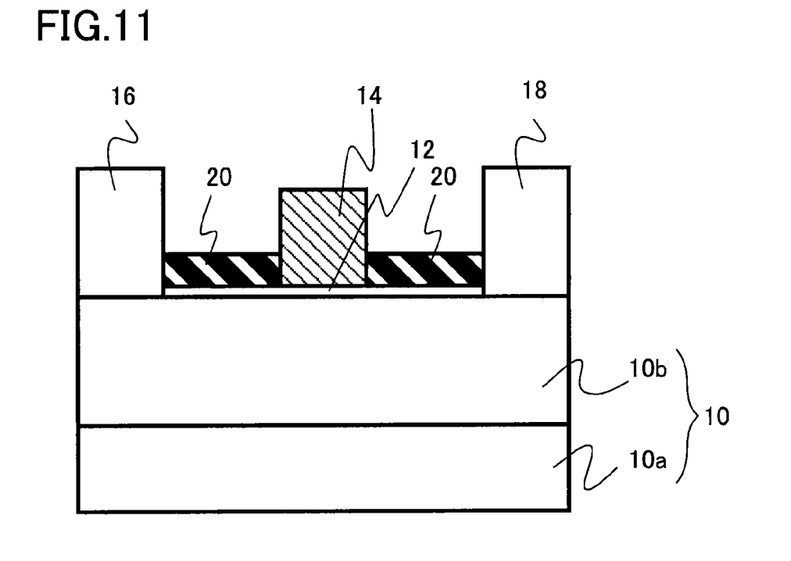
FIG. 11 is a cross-sectional view showing a configuration of a semiconductor device of a fourth embodiment.

FIG. 11 is a cross-sectional view showing a configuration of a semiconductor device of the present embodiment. The present embodiment is the same as the first embodiment except that a first silicon nitride film 12 serving as a gate insulation film is provided between a semiconductor layer 10 and a second silicon nitride film 20 serving as a surface passivation film. Therefore, the contents which are a duplicate of the first embodiment will not be described.

The embodiments have been described in connection with an example of a field effect transistor using a hetero junction, but the embodiments are not limited thereto. The present embodiments may be applied to other transistors using an III-V group nitride semiconductor.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a first silicon nitride film on a semiconductor layer formed of a III-V group nitride semiconductor;
    forming a gate electrode on the first silicon nitride film; and forming a second silicon nitride film having a lower oxygen atom density than the first silicon nitride film on the semiconductor layer, on both sides of the gate electrode, wherein a hydrogen atom density of the first silicon nitride film is one digit or more lower than a hydrogen atom density of the second silicon nitride film.

2. A method for manufacturing a semiconductor device, comprising:

forming a first silicon nitride film on a semiconductor layer formed of a III-V group nitride semiconductor;

forming a gate electrode on the first silicon nitride film; and forming a second silicon nitride film having a lower oxygen atom density than the first silicon nitride film on the semiconductor layer, on both sides of the gate electrode, wherein an oxygen atom density of the second silicon nitride film is one digit or more lower than an oxygen atom density of the first silicon nitride film and greater than $1\times10^{18}$ atoms/cm$^3$, and the oxygen atom density of the first silicon nitride film is equal to or lower than $1\times10^{21}$ atoms/cm$^3$.

* * * * *